United States Patent
Sugawara et al.

(10) Patent No.: US 7,893,760 B2
(45) Date of Patent: Feb. 22, 2011

(54) AMPLIFIER CIRCUIT

(75) Inventors: Mariko Sugawara, Kawasaki (JP);
Yukito Tsunoda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/547,629

(22) Filed: Aug. 26, 2009

(65) Prior Publication Data

US 2010/0052791 A1    Mar. 4, 2010

(30) Foreign Application Priority Data

Sep. 2, 2008  (JP) .............................. 2008-224867

(51) Int. Cl.
*H03F 3/68*    (2006.01)
(52) U.S. Cl. .............................. 330/85; 330/98; 330/100
(58) Field of Classification Search .................... 330/85, 330/98, 100
See application file for complete search history.

(56) References Cited

U.S. PATENT DOCUMENTS

| 5,337,010 | A |  | 8/1994 | Nishiyama |  |
|---|---|---|---|---|---|
| 5,568,089 | A |  | 10/1996 | Maru |  |
| 6,057,738 | A | * | 5/2000 | Ku et al. .................... | 330/308 |
| 6,404,281 | B1 | * | 6/2002 | Kobayashi ................... | 330/85 |
| 6,407,636 | B1 | * | 6/2002 | Goutti ........................ | 330/255 |
| 6,515,546 | B2 | * | 2/2003 | Liwinski .................... | 330/296 |
| 6,801,084 | B2 | * | 10/2004 | Smith et al. .................. | 330/98 |
| 6,842,075 | B2 | * | 1/2005 | Johnson et al. ............. | 330/296 |
| 6,919,762 | B2 |  | 7/2005 | Akamine |  |
| 7,026,870 | B2 | * | 4/2006 | Nakamura et al. ............ | 330/85 |
| 7,193,471 | B2 | * | 3/2007 | Tsutsui et al. ............... | 330/285 |

FOREIGN PATENT DOCUMENTS

| JP | H04-145711 | 5/1992 |
|---|---|---|
| JP | H05-218755 | 8/1993 |
| JP | H07-007340 | 1/1995 |
| JP | H08-256024 | 10/1996 |
| JP | H10-247831 | 9/1998 |
| JP | H11-298260 | 10/1999 |
| JP | 2004-193846 | 7/2004 |

* cited by examiner

*Primary Examiner*—Patricia Nguyen
(74) *Attorney, Agent, or Firm*—Fujitsu Patent Center

(57) ABSTRACT

An amplifier circuit including: a multistage amplifier unit including an input-stage transistor and an output-stage transistor and configured to amplify an input signal and to output an amplified signal; and a feedback unit including a first feedback transistor, a second feedback transistor, and a feedback resistor, and configured to feed back the amplified signal to an input of the output-stage transistor in the multistage amplifier unit via the first feedback transistor, the second feedback transistor, and the feedback resistor.

9 Claims, 15 Drawing Sheets

AMPLIFIER CIRCUIT

CROSS-REFERENCE TO RELATED APPLICATION(S)

This application is based upon and claims the benefit of priority of the prior Japanese Patent Application No. 2008-224867, filed on Sep. 2, 2008, the entire contents of which are incorporated herein by reference.

FIELD

The present invention relates to an amplifier circuit and may be applied to an optical modulator driver circuit to drive an optical modulator.

BACKGROUND

Toward realizing a next generation network (NGN), establishment of a large-capacity photonics network with increased transmission speed and dense wavelength multiplexing is in progress. Concurrently, the introduction of a high-speed optical transmission system has gathered momentum.

A broadband and large-amplitude driver IC dedicated to drive an optical modulator is necessary to establish a high-speed optical transmission system. For example, in order to realize high-speed optical modulation of 40 G bits/second in an optical modulator using LiNbO3 (LN modulator), a driver circuit (driver IC) is required to operate in a broadband and to output a large-amplitude voltage of about 4 to 5 Vp-p to obtain a required electro-optic effect.

A feedback amplifier circuit has conventionally been known as a broadband amplifier circuit. For example, Japanese Laid-open Patent Publication No. 10-247831 describes a differential configuration using a pair of feedback amplifier circuits.

FIG. 14 illustrates a configuration of a main part of the amplifier circuit described in Japanese Laid-open Patent Publication No. 10-247831.

The amplifier circuit in FIG. 14 has a differential configuration including two feedback amplifier circuits, each including a two-stage emitter-grounded amplifier circuit 10 having an input-stage transistor 11, an output-stage transistor 12, and a load resistor RL; and a feedback circuit 20A having a feedback transistor 21 and a feedback resistor RF.

In the above-described feedback amplifier circuit, a signal having a frequency characteristic degraded by amplification in two stages is fed back to an input of a second amplifying stage, so that an eventual high-frequency component can be increased and a broadband frequency characteristic can be ensured.

As described above, the driver IC to drive an optical modulator requires not only a broad bandwidth but also a large amplitude. Accordingly, the amplitude of the output of the above-described conventional feedback amplifier circuit may be increased, which may be applied to the driver IC.

However, in the case of increasing the amplitude of the output of the above-described conventional feedback amplifier circuit, the following problem arises.

In the conventional configuration, the feedback resistor RF is set to a relatively small value so that a broadband frequency characteristic can be ensured, and thus the difference between the potential on the collector side of the output-stage transistor 12 (point B in FIG. 14) and the potential on the base side (point A in FIG. 14) is small. In other words, an operating-point potential of output is low (on the side of low potential VEE). Thus, even if an effort is made to increase the amplitude of the output, an increase in amplitude on the lower side is limited.

For this reason, in order to enable a large-amplitude output operation in the conventional configuration, it is necessary to increase the potential difference between the collector side (point B) and the base side (point A) of the output-stage transistor 12 (i.e., raise the operating-point potential of output) so that the increase in amplitude on the lower side is not limited.

In order to increase the potential difference between the collector side (point B) and the base side (point A) of the output-stage transistor 12, the value of the feedback resistor RF or the value of a drive current (control current) I may be increased.

However, if the value of the feedback resistor RF is increased, the frequency characteristic at point A degrades. On the other hand, if the value of the drive current I is increased, the size of the feedback transistor 21 should be increased. In that case, a stray capacitance CCB between the collector and base of the feedback transistor 21, which is parallel to the load resistor RL illustrated in an equivalent circuit diagram in FIG. 15, becomes large, so that the frequency characteristic at point B degrades.

As described above, in the amplifier circuit having the conventional configuration, it is difficult to ensure both a broadband frequency characteristic and a large-amplitude output.

SUMMARY

An amplifier circuit including: a multistage amplifier unit having an input-stage transistor and an output-stage transistor and configured to amplify an input signal and to output an amplified signal; and a feedback unit having a first feedback transistor, a second feedback transistor, and a feedback resistor, and configured to feed back the amplified signal to an input of the output-stage transistor in the multistage amplifier unit via the first feedback transistor, the second feedback transistor, and the feedback resistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF THE PREFERRED EMBODIMENTS

Figure 1:
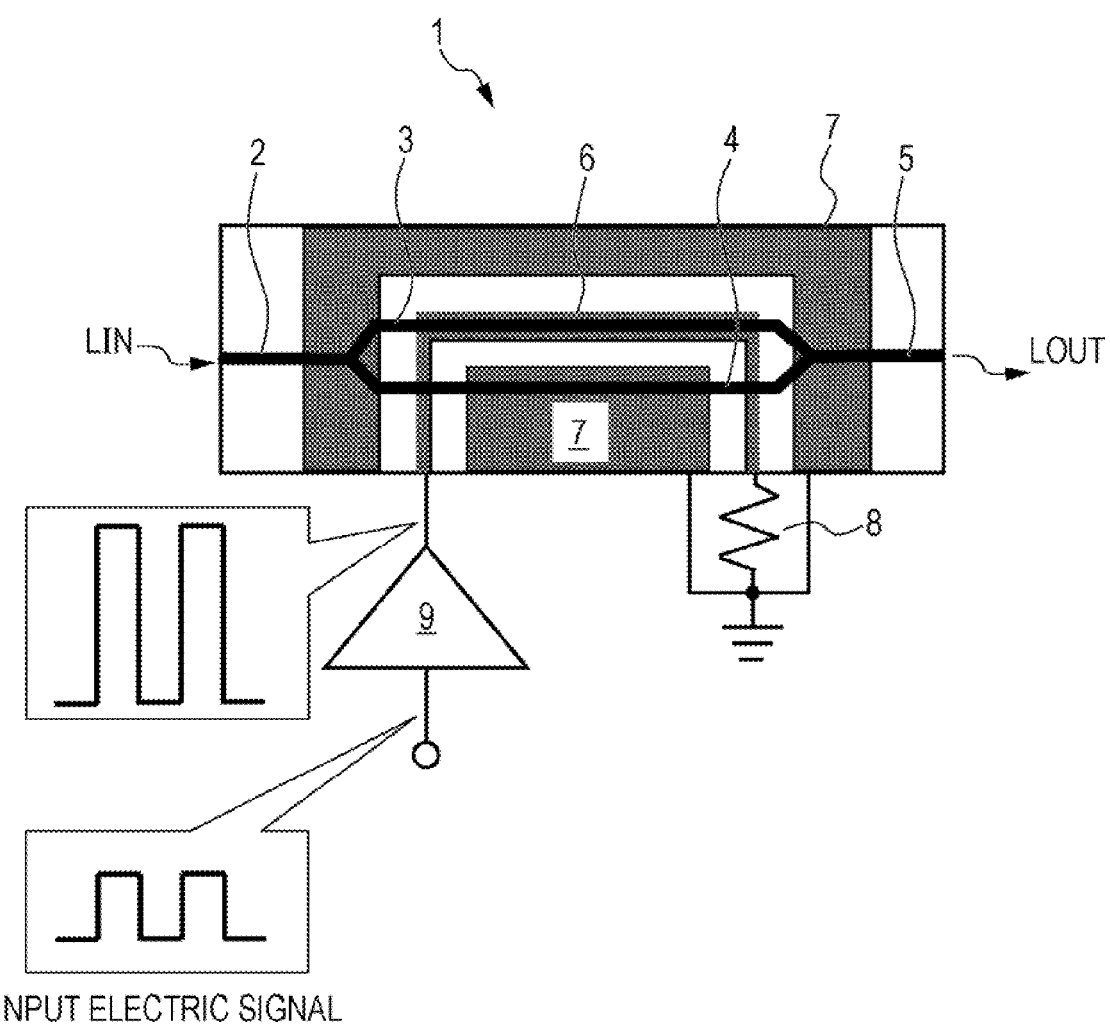
FIG. 1 illustrates an LN modulator.

Reference will now be made in detail to the embodiments, examples of which are illustrated in the accompanying drawings, wherein like reference numerals refer to the like elements throughout. The embodiments are described below to explain the present invention by referring to the figures.

FIG. 1 illustrates an optical modulator. The optical modulator illustrated in FIG. 1 is an LN modulator including optical waveguides and electrodes positioned on a substrate of LiNbO3, which has an electro-optic effect. In FIG. 1, the LN modulator 1 includes, as the optical waveguides, an input waveguide 2, a pair of branch waveguides 3 and 4 branched from the input waveguide 2, and an output waveguide 5 to which the pair of branch waveguides 3 and 4 joins.

A signal electrode 6 is positioned above the branch waveguide 3, and a ground electrode 7 is positioned above the branch waveguide 4. The signal electrode 6, an output end thereof being grounded via a resistor 8, works as a traveling-wave electrode. A driver IC 9 amplifies an input electric signal and supplies the electric signal to an input end of the signal electrode 6. Although not illustrated in FIG. 1, a buffer layer is provided between the optical waveguides and the electrodes 6 and 7 in order to prevent light, which propagates in the branch waveguides 3 and 4, from being absorbed by the signal electrode 6 and the ground electrode 7.

In the configuration illustrated in FIG. 1, a light signal LIN given from the outside to the input waveguide 2 is supplied to the branch waveguides 3 and 4 while being branched. When an electric signal is input from the driver IC 9 to the signal electrode 6, an electric field is generated between the signal electrode 6 and the ground electrode 7, and the electric field causes a change in a refractive index of the branch waveguides 3 and 4. As a result, a phase difference in light propagating in the branch waveguides 3 and 4 changes, so that a light signal LOUT, which is intensity modulated by Mach-Zehnder interferometer configuration, is output from the output waveguide 5.

As described above, in recent years, the driver IC for an optical modulator with a high output and a broad bandwidth is desired, particularly in the driver IC for an optical modulator using an electro-optic effect, such as an LN modulator. Hereinafter, a description is given about an amplifier circuit that may be applied to such a driver IC for an optical modulator and that is capable of ensuring a large-amplitude output and a broadband frequency characteristic.

Figure 2:
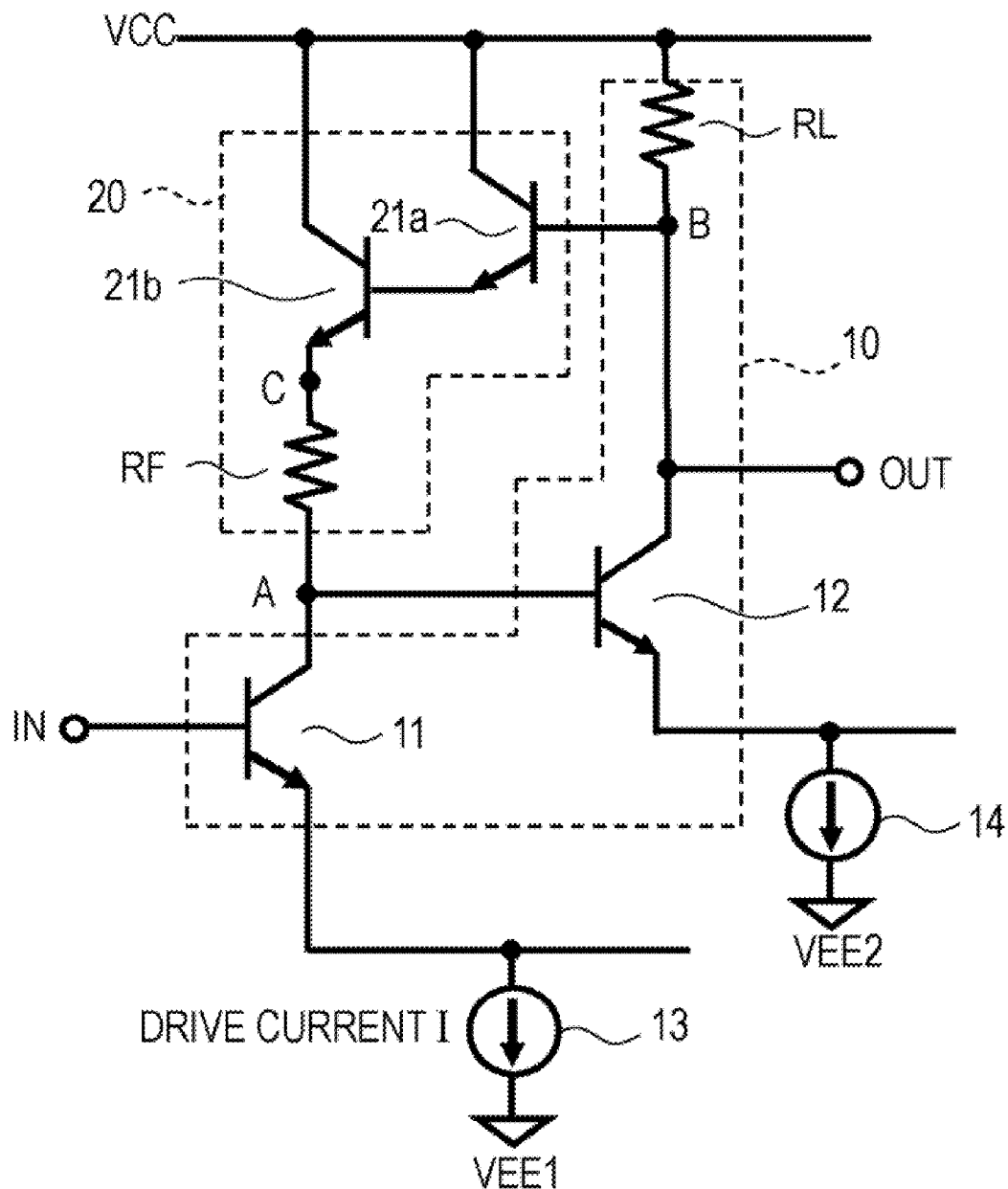
FIG. 2 illustrates an amplifier circuit in a first embodiment.

FIG. 2 illustrates a configuration of the main part of an amplifier circuit in a first embodiment. In the first embodiment, bipolar transistors are used as transistors.

Figure 14:
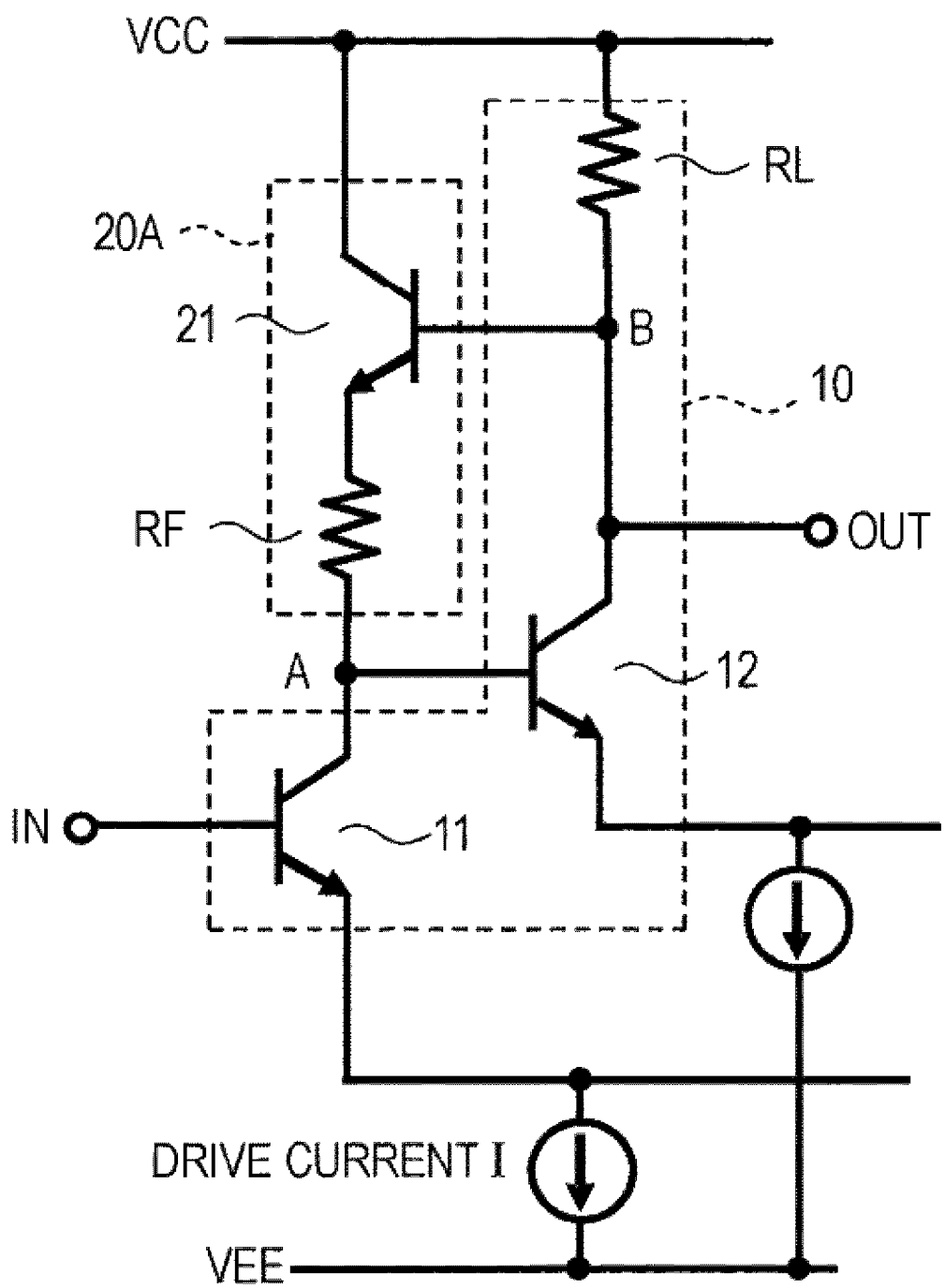
FIG. 14 illustrates a conventional feedback amplifier circuit.

Comparing the configuration of the feedback amplifier circuit illustrated in FIG. 14, in the amplifier circuit in the first embodiment, a transistor is further provided on the input side of the feedback transistor 21.

As illustrated in FIG. 2, the amplifier circuit in the first embodiment includes a two-stage emitter-grounded amplifier circuit (corresponding to "multistage amplifier unit") 10 and a feedback circuit (corresponding to "feedback unit") 20 to feed back an output of the two-stage emitter-grounded amplifier circuit 10 to an input of a second amplifying stage in the second-stage emitter-grounded amplifier circuit 10.

The two-stage emitter-grounded amplifier circuit 10 includes an input-stage transistor 11 in a first stage, an output-stage transistor 12 in a second stage (last stage), and a load resistor RL.

A base terminal of the input-stage transistor 11 is connected to an input terminal IN of the amplifier circuit, and an emitter terminal thereof is connected to a low potential VEE1 via a constant current source 13. The input-stage transistor 11 amplifies a signal input from the outside to the base terminal via the input terminal IN and outputs the signal from a collector terminal. The input-stage transistor 11 corresponds to a first emitter-grounded transistor.

A base terminal of the output-stage transistor 12 is connected to the collector terminal of the input-stage transistor 11, an emitter terminal thereof is connected to a low potential VEE2 via a constant current source 14, and a collector terminal thereof is connected to a high potential VCC via the load resistor RL. The output-stage transistor 12 further amplifies the output of the input-stage transistor 11, input to the base terminal (corresponding to an input terminal of the output-stage transistor), and outputs the output from the collector terminal. The output-stage transistor 12 corresponds to a second emitter-grounded transistor. An output terminal OUT is connected between the collector terminal of the output-stage transistor 12 and the load resistor RL.

On the other hand, the feedback circuit 20 includes two feedback transistors (a first feedback transistor 21a and a second feedback transistor 21b) and a feedback resistor RF. Here, the second feedback transistor 21b corresponds to the feedback transistor 21 illustrated in FIG. 14.

A base terminal of the first feedback transistor 21a is connected to the collector terminal of the output-stage transistor 12 (corresponding to an output terminal of the output-stage transistor), and a collector terminal thereof is connected to the high potential (power supply potential) VCC. The first feedback transistor 21a corresponds to a first collector-grounded transistor.

A base terminal of the second feedback transistor 21b is connected to an emitter terminal of the first feedback transistor 21a, and a collector terminal thereof is connected to the high potential (power supply potential) VCC. The second feedback transistor 21b corresponds to a second collector-grounded transistor.

That is, in the feedback circuit 20, the first feedback transistor 21a and the second feedback transistor 21b are connected by a Darlington connection.

The feedback resistor RF is connected between the emitter terminal of the second feedback transistor 21b and the base terminal of the output-stage transistor 12 (input terminal of the output-stage transistor).

In the first embodiment, the emitter terminal of the input-stage transistor 11 is connected to the low potential VEE1, whereas the emitter terminal of the output-stage transistor 12 is connected to the low potential VEE2. For example, the low potential VEE1=−1 V, whereas the low potential VEE2=0 V. In this way, the two transistors can be connected to the different potentials (in this case, the high potential VCC=8 to 10 V, for example). Alternatively, both transistors may be connected to a common low potential VEE (e.g., 0 V).

As described above, when a large-amplitude output is to be realized in the conventional feedback amplifier circuit illustrated in FIG. 14, the value of the feedback resistor RF or the drive current I needs to be increased. However, such an increase causes degradation of a frequency characteristic, and thus it is difficult to realize both a large-amplitude output and ensure a broadband frequency characteristic.

On the other hand, in the amplifier circuit in the first embodiment, the first feedback transistor 21a is added to the configuration of the conventional feedback amplifier circuit illustrated in FIG. 14. With this configuration, the output of the second-stage emitter-grounded amplifier circuit 10 is fed back to the input of the output-stage transistor 12 via the first feedback transistor 21a, the second feedback transistor 21b, and the feedback resistor RF.

A voltage drop occurs between the base and emitter of a transistor. Therefore, in the amplifier circuit in the first embodiment, the voltage drop between point B (the base of the first feedback transistor 21a) and point C (the emitter of the second feedback transistor 21b) is larger in accordance with the additionally-provided first feedback transistor 21a, compared to the conventional feedback amplifier circuit. As a result, the potential difference between point B and point A (the base of the output-stage transistor 12) may be ensured without increasing the value of the feedback resistor RF or the drive current I (furthermore, by minimizing the value of the feedback resistor RF), and the operating-point potential (DC level) of the output of the amplifier circuit may be raised. Accordingly, even in the conventional feedback amplifier circuit configured to ensure a broadband frequency characteristic, a large-amplitude output may be realized while preventing degradation of the frequency characteristic at point A.

Figure 15:
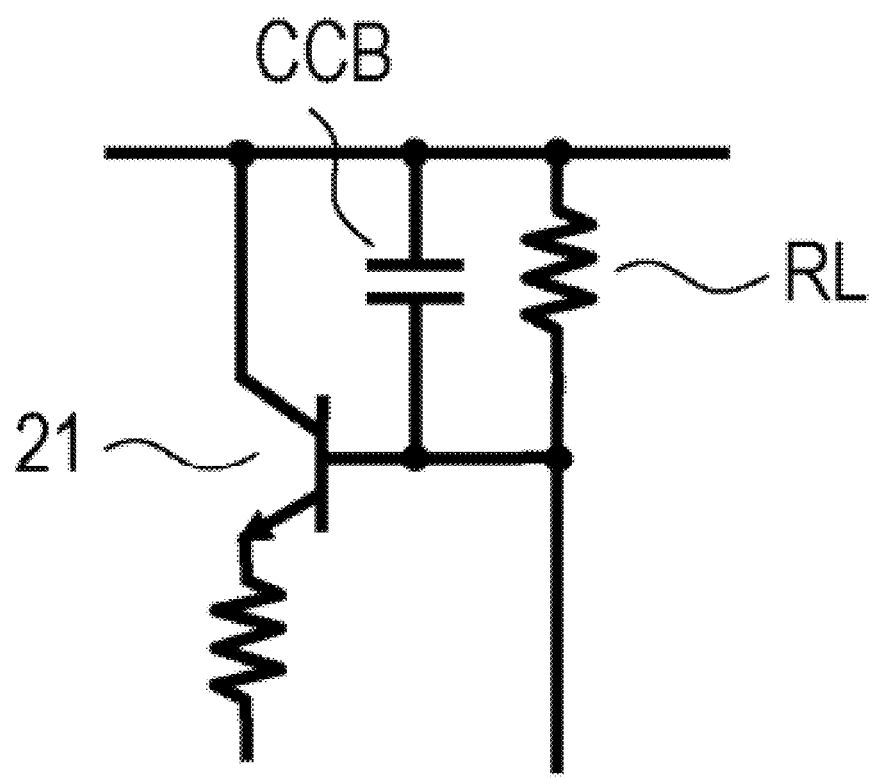
FIG. 15 is for describing a problem that arises when a large amplitude is realized in the conventional feedback amplifier circuit.

Furthermore, when the size of the first feedback transistor 21a (i.e., the feedback transistor added to the conventional configuration) is smaller than the size of the second feedback transistor 21b (i.e., the conventional feedback transistor), the stray capacitance between the collector and base of the first feedback transistor 21a, which is parallel to the load resistor RL, may be suppressed to be smaller than the conventional stray capacitance CCB illustrated in the equivalent circuit diagram in FIG. 15. Accordingly, degradation of the frequency characteristic at point B may be reduced if not prevented.

As described above, in the amplifier circuit in the first embodiment, a large-amplitude output is realized while ensuring a broadband frequency characteristic. When the amplifier circuit is applied to the driver IC 9, a circuit configuration capable of eliminating an influence of variations in transistors is desirably adopted.

Figure 3:
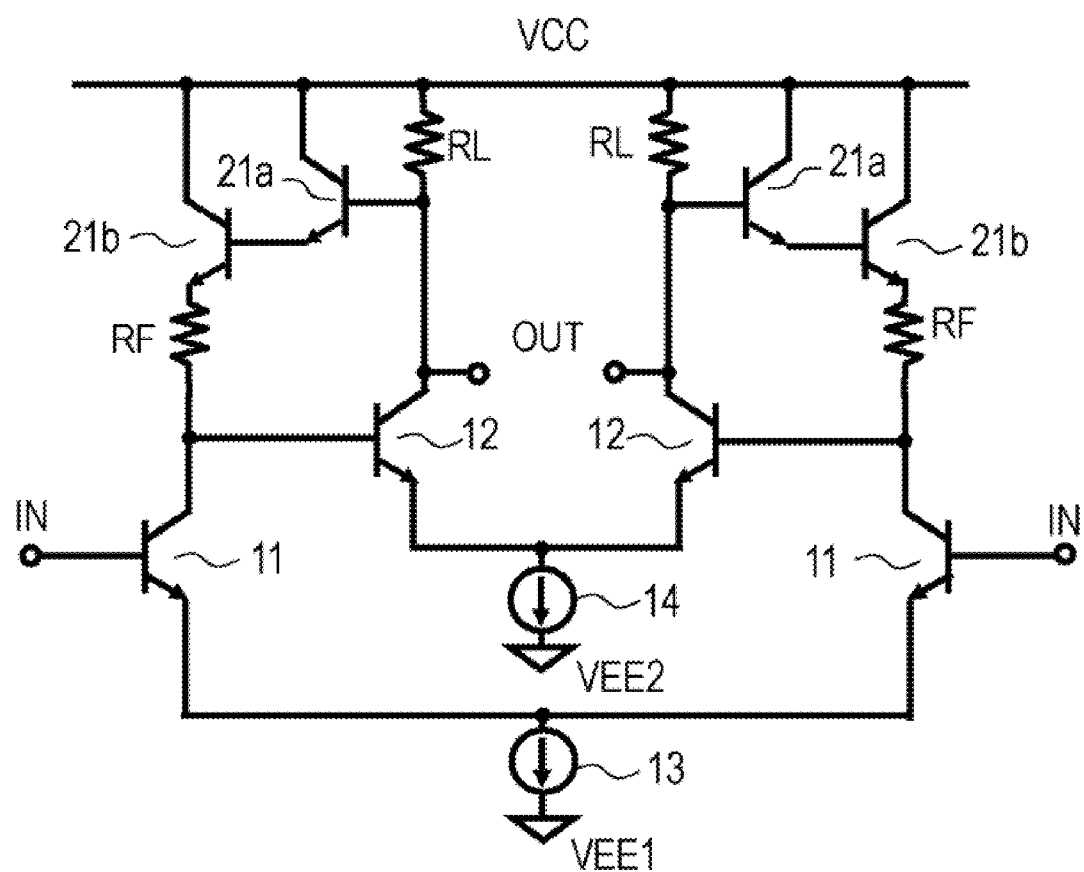
FIG. 3 illustrates a differential amplifier circuit including a pair of amplifier circuits, each being the amplifier circuit in the first embodiment.

Thus, when the amplifier circuit is applied to the driver IC 9, a differential pair including two amplifier circuits, each being the amplifier circuit in the first embodiment, is configured into a feedback differential amplifier circuit, as illustrated in FIG. 3. By using such a differential configuration, the influence of in-phase noise or variations of respective transistors may be reduced if not eliminated and a more favorable circuit for the driver IC 9 may be provided.

Figure 4:
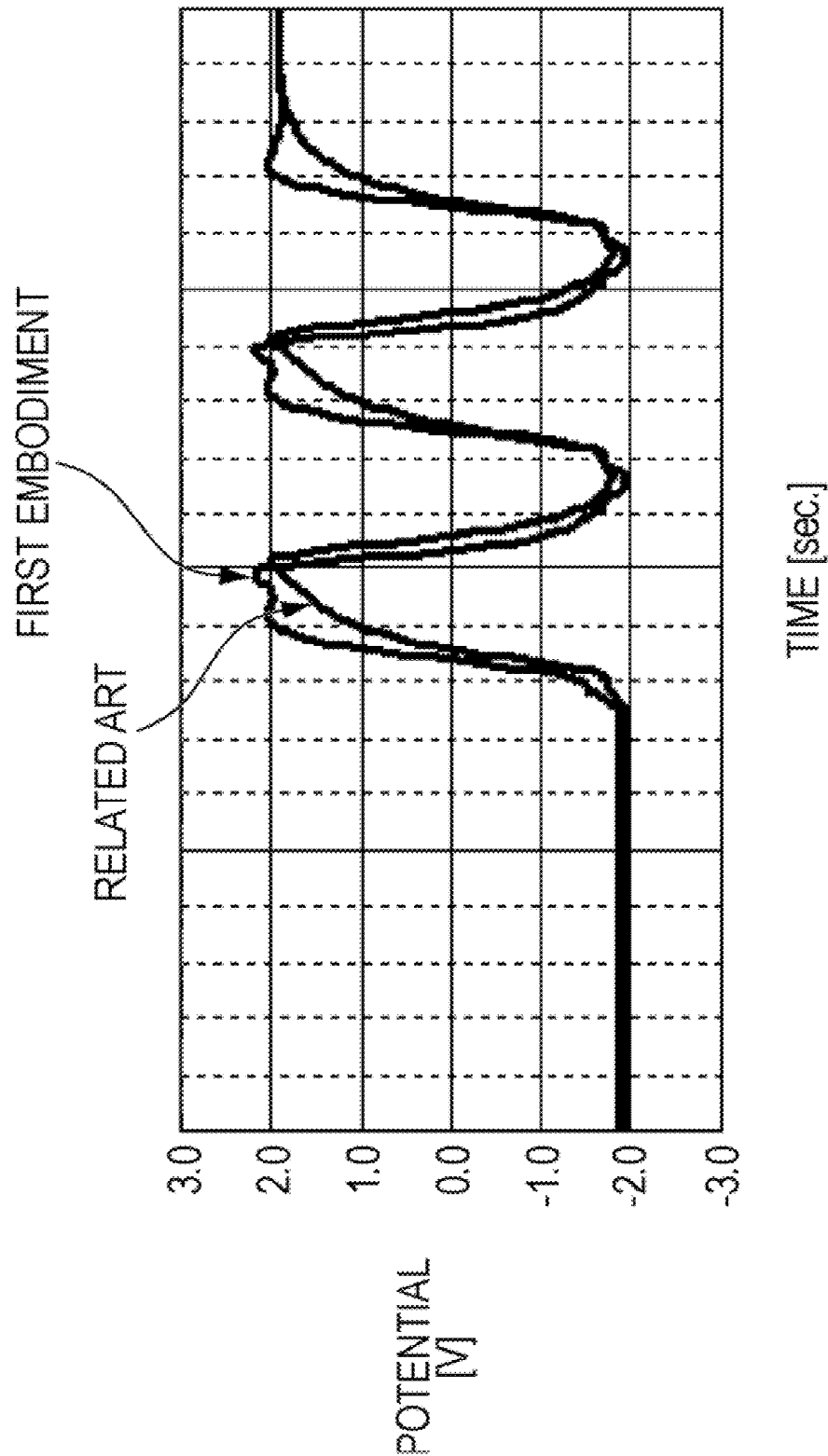
FIG. 4 illustrates output waveforms of the amplifier circuit in the first embodiment and a conventional feedback amplifier circuit.

FIG. 4 illustrates output waveforms of the amplifier circuit (feedback differential amplifier circuit) in the first embodiment and the conventional feedback amplifier circuit (feedback differential amplifier circuit) illustrated in FIG. 14.

As illustrated in FIG. 4, in the first embodiment, the responsiveness to output of a large-amplitude voltage (4 Vp-p) is significantly improved and a favorable output waveform may be obtained compared to the conventional configuration.

In the first embodiment described above, bipolar transistors are used as the transistors. Alternatively, field-effect transistors may be used.

Figure 5:
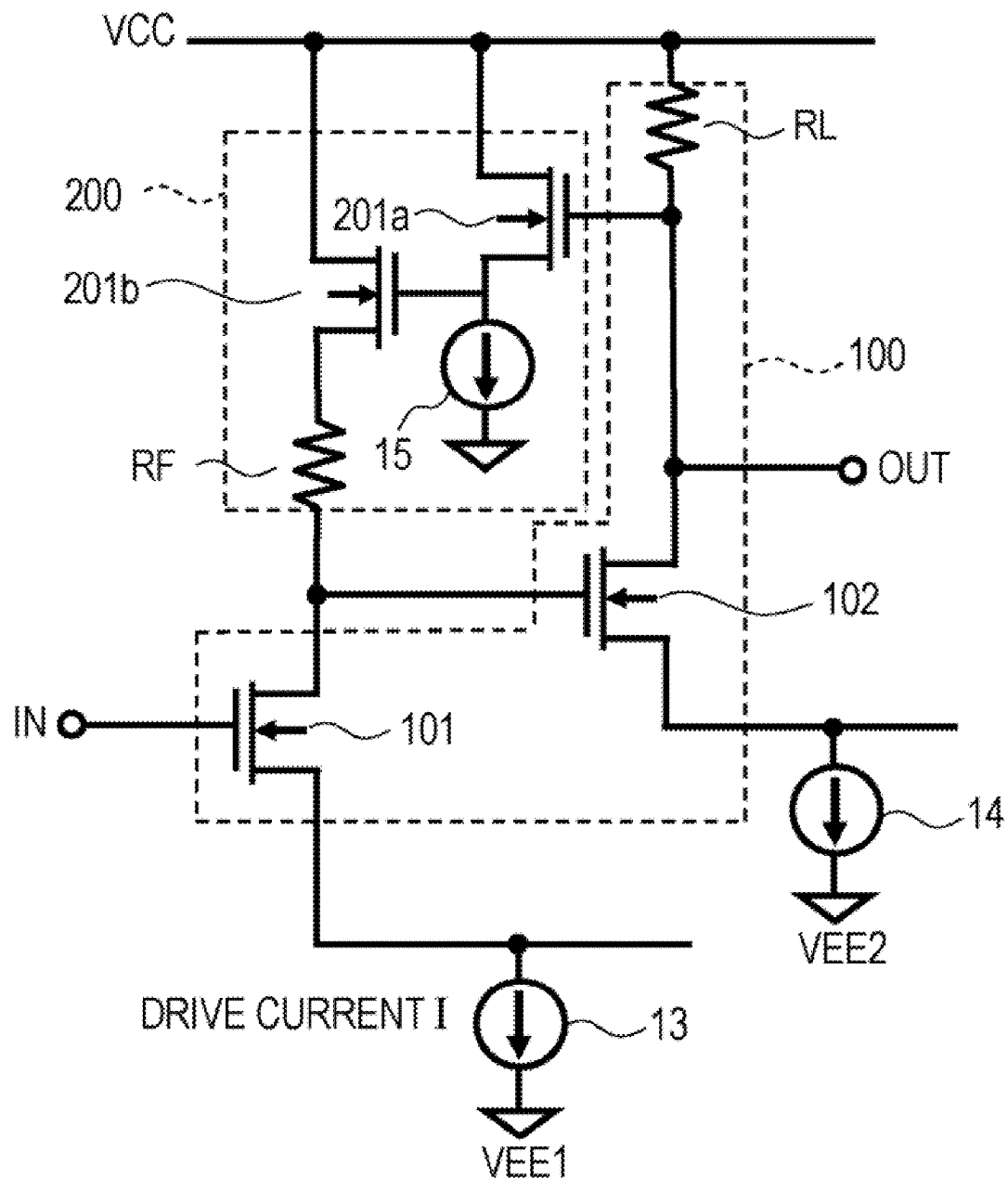
FIG. 5 illustrates an amplifier circuit in a second embodiment.

FIG. 5 illustrates a configuration of a main part of an amplifier circuit in a second embodiment, in which field-effect transistors are used as transistors. The basic configuration thereof is the same as that in the first embodiment.

As illustrated in FIG. 5, the amplifier circuit in the second embodiment includes a two-stage source-grounded amplifier circuit 100 and a feedback circuit 200 to feed back an output of the two-stage source-grounded amplifier circuit 100 to an input of a second amplifying stage in the two-stage source-grounded amplifier circuit 100.

The two-stage source-grounded amplifier circuit 100 includes an input-stage transistor 101 in a first stage, an output-stage transistor 102 in a second stage (last stage), and a load resistor RL.

A gate terminal of the input-stage transistor 101 is connected to an input terminal IN of the amplifier circuit, and a source terminal thereof is connected to a low potential VEE1 via a constant current source 13. The input-stage transistor 101 amplifies a signal input to the gate terminal via the input terminal IN and outputs the signal from a drain terminal. The input-stage transistor 101 corresponds to a first source-grounded transistor.

A gate terminal of the output-stage transistor 102 is connected to the drain terminal of the input-stage transistor 101, a source terminal thereof is connected to a low potential VEE2 via a constant current source 14, and a drain terminal thereof is connected to a high potential VCC via the load resistor RL. The output-stage transistor 102 further amplifies the output of the input-stage transistor 101, input to the gate terminal (corresponding to an input terminal of the output-stage transistor), and outputs the output from the drain terminal. The output-stage transistor 102 corresponds to a second source-grounded transistor. An output terminal OUT is connected between the drain terminal of the output-stage transistor 102 and the load resistor RL.

The feedback circuit 200 includes two feedback transistors (first feedback transistor 201a and second feedback transistor 201b) and a feedback resistor RF.

A gate terminal of the first feedback transistor 201a is connected to the drain terminal of the output-stage transistor 102 (corresponding to an output terminal of the output-stage transistor), a source terminal thereof is connected to a constant current source 15, and a drain terminal thereof is connected to the high potential (power supply potential) VCC. The first feedback transistor 201a corresponds to a first drain-grounded transistor.

A gate terminal of the second feedback transistor 201b is connected to the source terminal of the first feedback transistor 201a, and a drain terminal thereof is connected to the high potential (power supply potential) VCC. The second feedback transistor 201b corresponds to a second drain-grounded transistor.

That is, in the feedback circuit 200, the first feedback transistor 201a and the second feedback transistor 201b are cascaded. Although not illustrated in FIG. 5, a matching circuit may be provided between the first feedback transistor 201a and the second feedback transistor 201b. The matching circuit is used to realize input/output impedance matching, for example, but such a matching circuit is known and thus the description thereof is omitted here (see Japanese Laid-open Patent Publication No. 11-298260, for example).

The feedback resistor RF is connected between the source terminal of the second feedback transistor 201b and the gate terminal of the output-stage transistor 102 (input terminal of the output-stage transistor).

Figure 6:
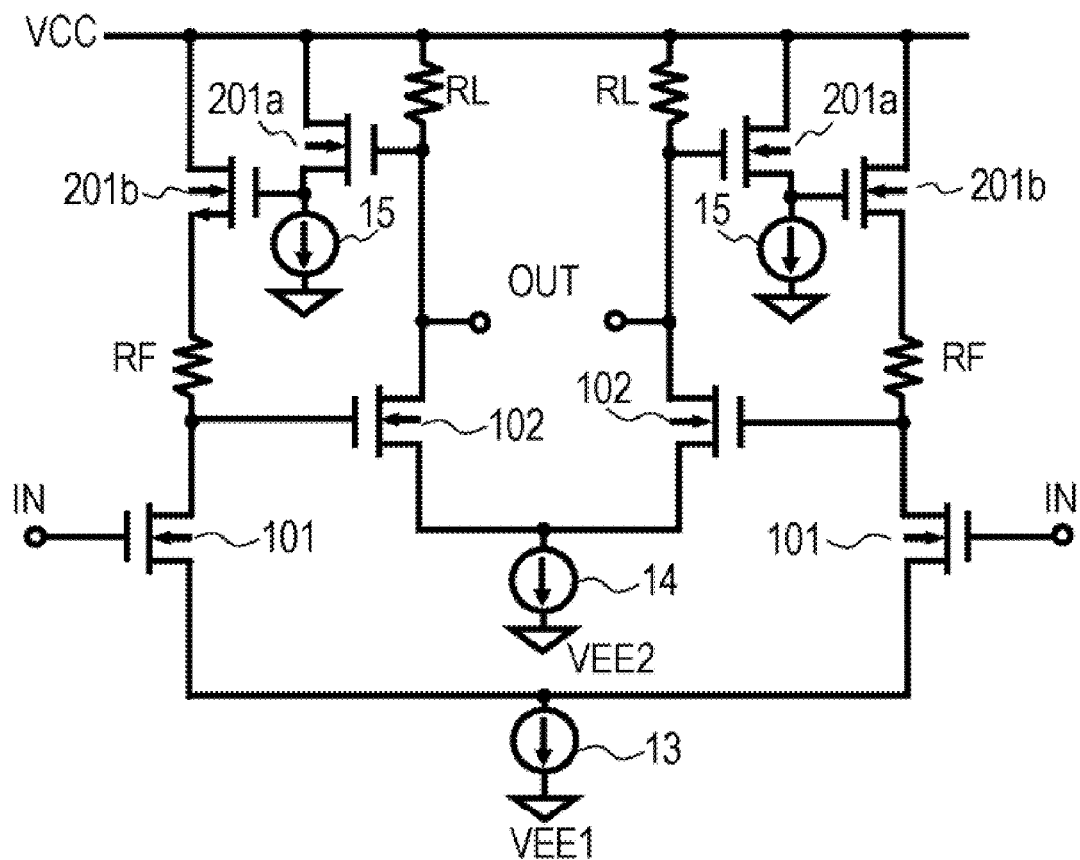
FIG. 6 illustrates a differential amplifier circuit including a pair of amplifier circuits, each being the amplifier circuit in the second embodiment.

When the amplifier circuit is applied to the driver IC 9, as in the first embodiment, a differential pair including two amplifier circuits, each being the amplifier circuit in the second embodiment, is configured into a feedback differential amplifier circuit, as illustrated in FIG. 6. In the second embodiment, the same operations and effects as those in the first embodiment are obtained.

In the above-described first and second embodiments, descriptions have been given about amplifier circuits each including a two-stage amplifier unit (circuit) having two transistors and a feedback unit (circuit) having two transistors. However, the present invention is not limited to those configurations. For example, the amplifier circuit may include a multistage amplifier unit (circuit) having three or more amplifying stages and a feedback unit (circuit) having three or more transistors.

That is, any configuration may be accepted as long as the amplifier circuit includes a multistage amplifier unit (circuit) that includes an input-stage transistor and an output-stage transistor and that amplifies an input signal from the outside by the input-stage transistor and the output-stage transistor and outputs the signal; and a feedback unit (circuit) to feed back an output of the multistage amplifier unit (circuit) to an input of the output-stage transistor, wherein the feedback unit (circuit) feeds back the output of the multistage amplifier unit (circuit) to the input of the output-stage transistor via at least two feedback transistors and a feedback resistor.

The first and second embodiments are basic embodiments, and various modifications may be possible. Hereinafter, some modifications of the first and second embodiments are described for reference.

FIGS. 7 to 10 illustrate modifications of the first embodiment (feedback differential amplifier circuit). In the respective figures, the elements of which reference numerals are omitted are the same as those in the first embodiment (FIGS. 2 and 3).

Figure 7:
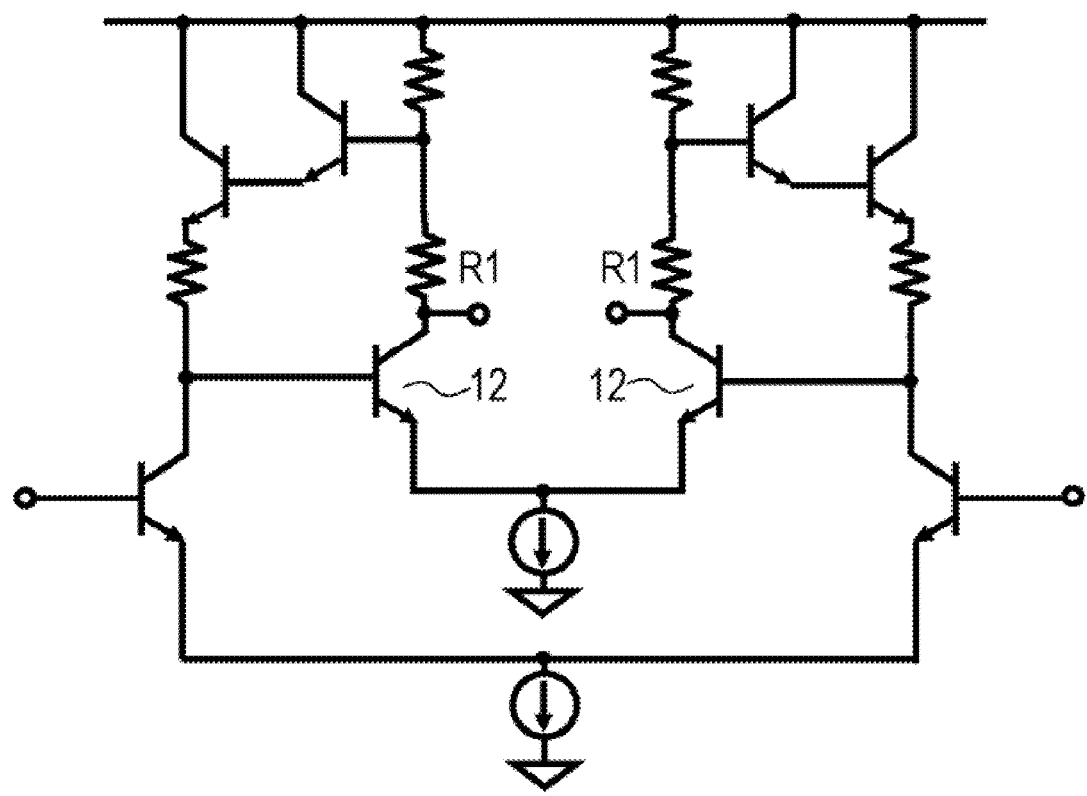
FIG. 7 illustrates a modification of the amplifier circuit (differential amplifier circuit) in the first embodiment.
Figure 8:
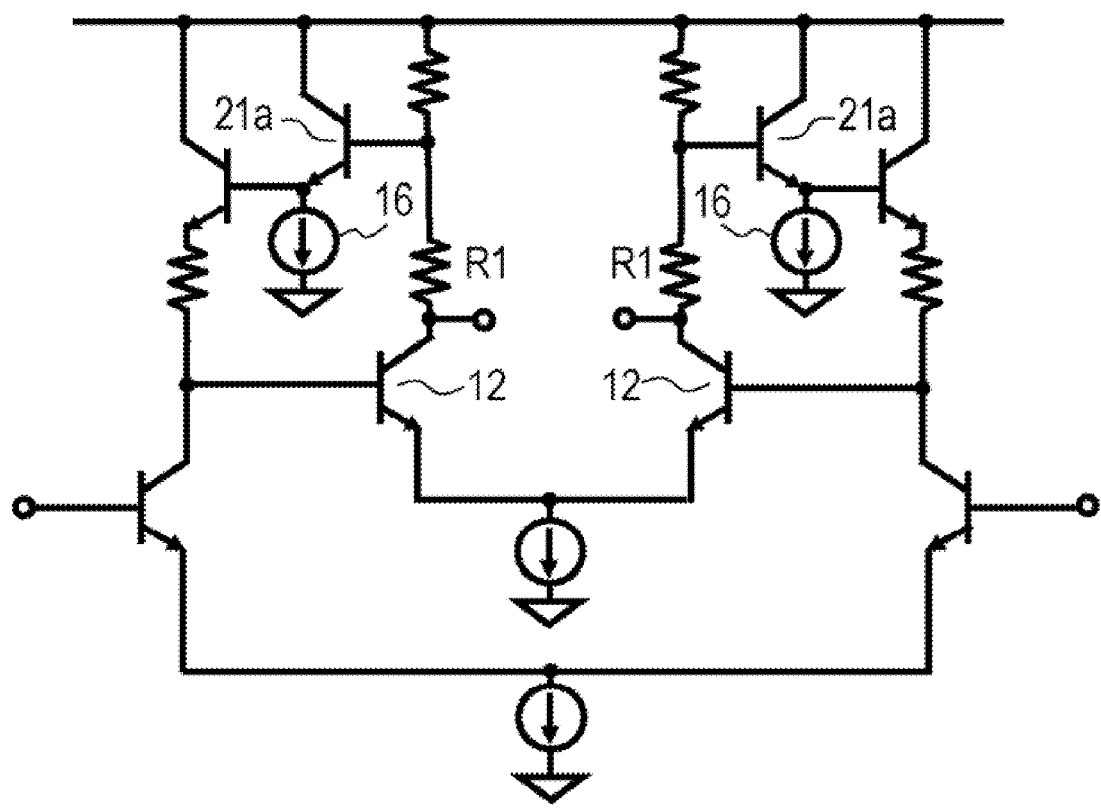
FIG. 8 illustrates a modification of the amplifier circuit (differential amplifier circuit) in the first embodiment.
Figure 9:
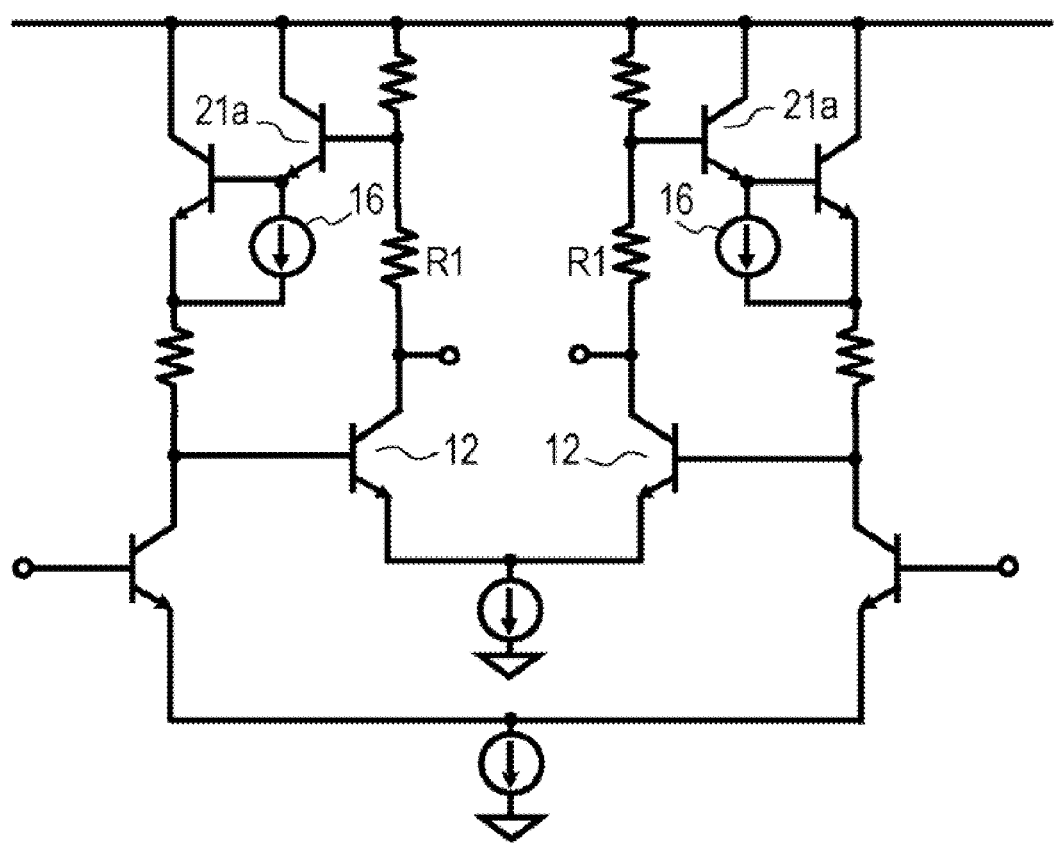
FIG. 9 illustrates a modification of the amplifier circuit (differential amplifier circuit) in the first embodiment.
Figure 10:
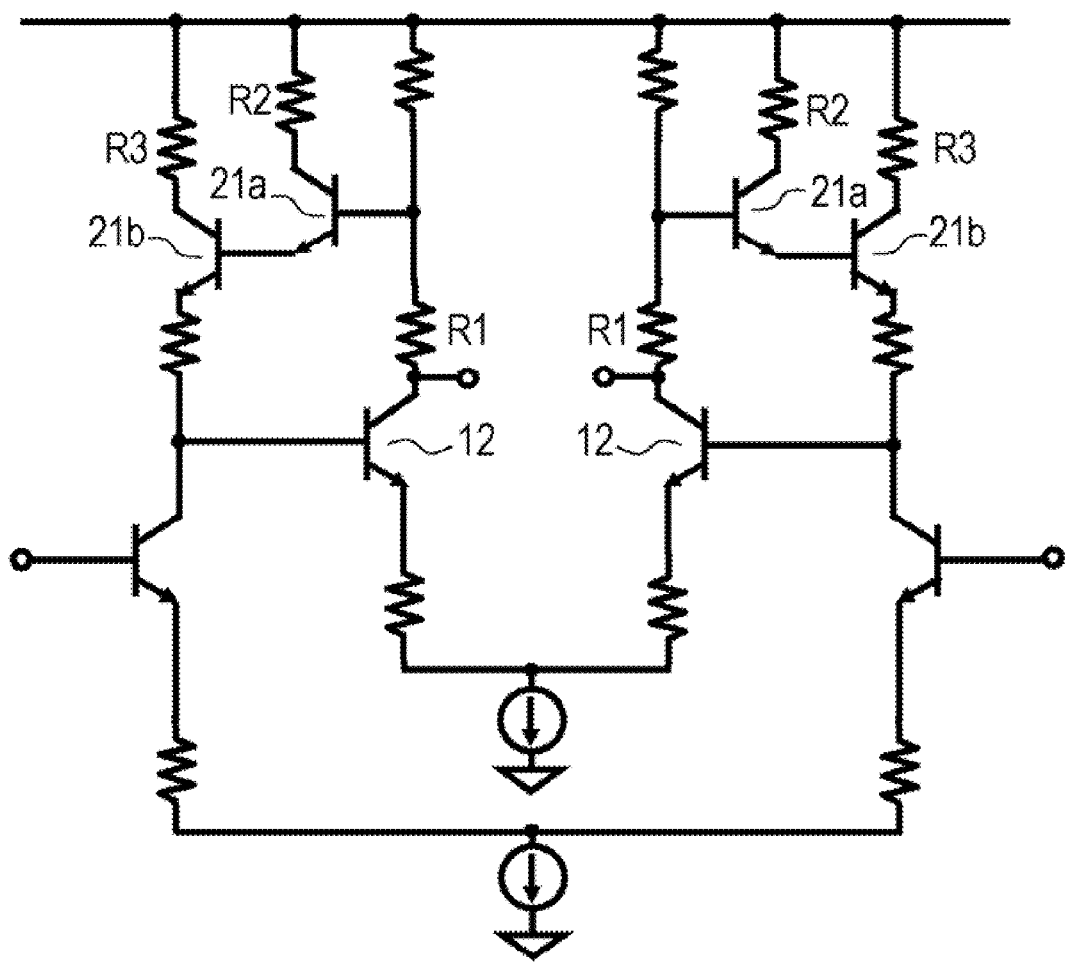
FIG. 10 illustrates a modification of the amplifier circuit (differential amplifier circuit) in the first embodiment.

In the configuration illustrated in FIG. 7, resistors (emitter resistors) R1 connected to the collector terminals of the output-stage transistors 12 in the first embodiment (FIG. 3) are further provided. In the configurations illustrated in FIGS. 8 and 9, constant current sources 16 connected to the emitter terminals of the first feedback transistors 21a are further provided. Note that the connection form of the constant current sources 16 in FIG. 8 is different from that in FIG. 9. In the configuration illustrated in FIG. 10, resistors R2 and R3 connected to the collector terminals of the first feedback transistors 21a and the collector terminals of the second feedback transistors 21b are further provided to the configuration illustrated in FIG. 7. The respective elements further provided in FIGS. 7 to 10 may be appropriately adopted in combination.

Figure 11:
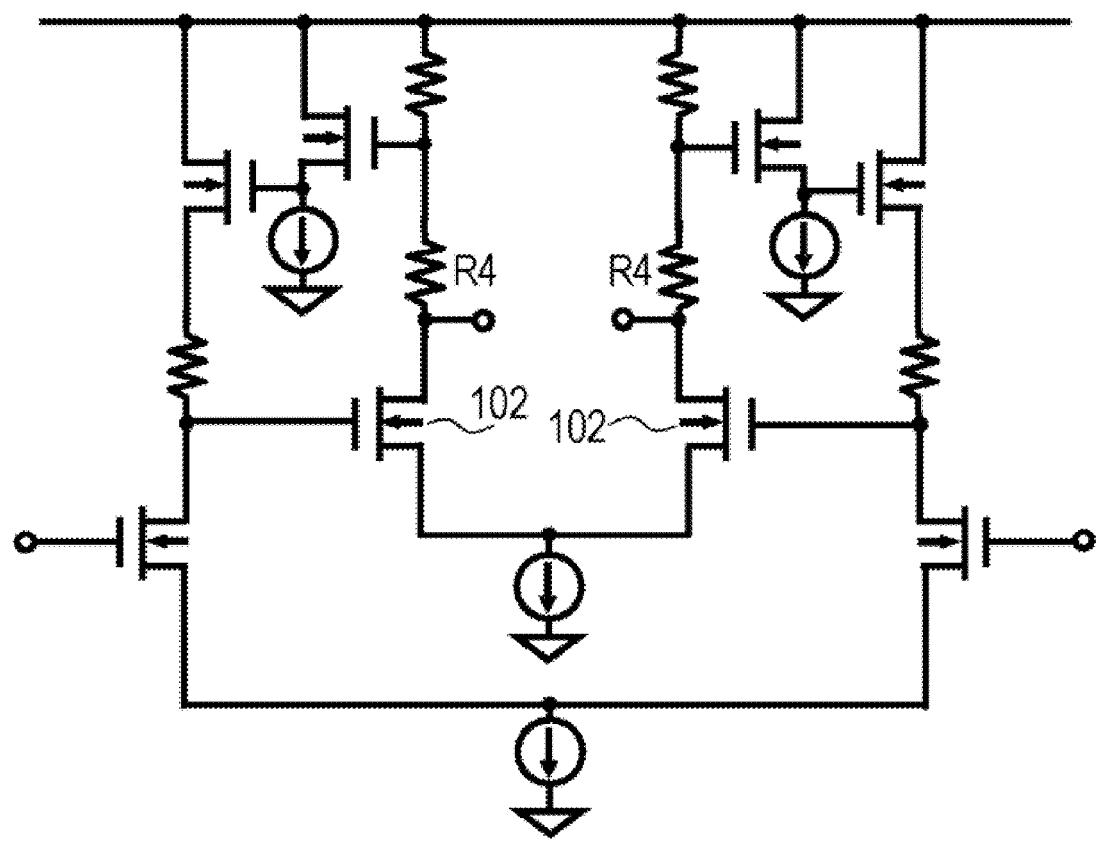
FIG. 11 illustrates a modification of the amplifier circuit (differential amplifier circuit) in the second embodiment.
Figure 12:
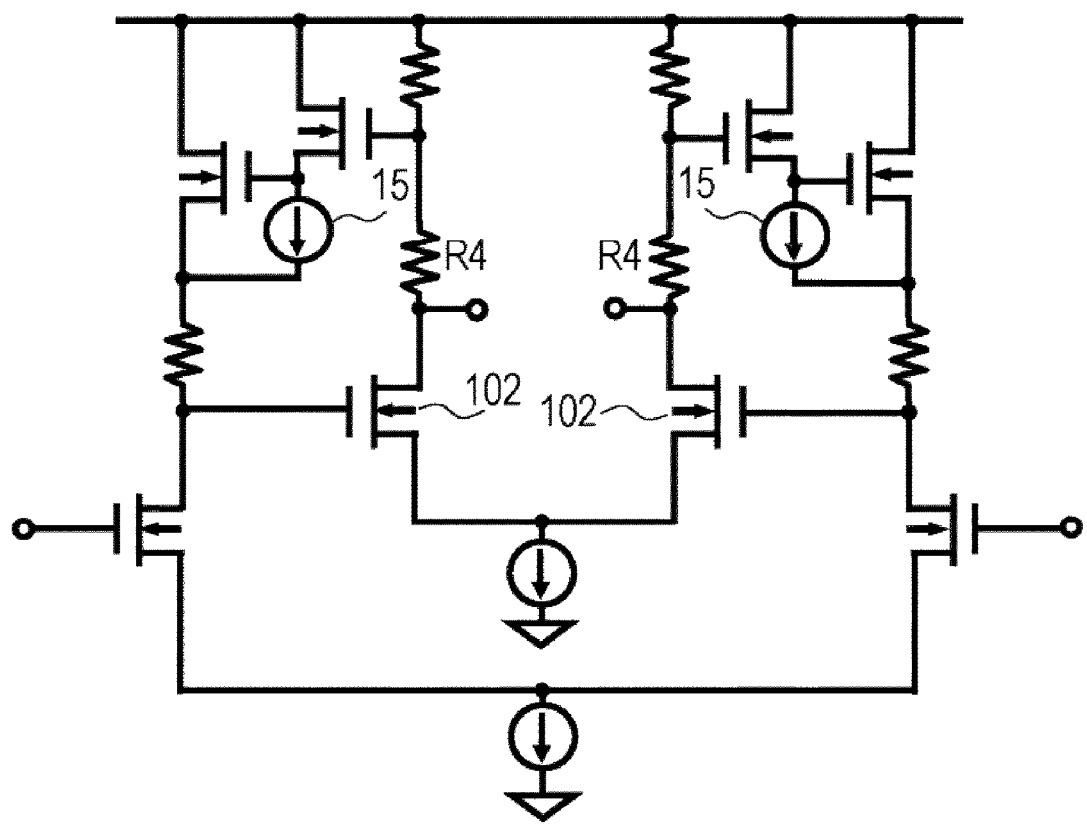
FIG. 12 illustrates a modification of the amplifier circuit (differential amplifier circuit) in the second embodiment.
Figure 13:
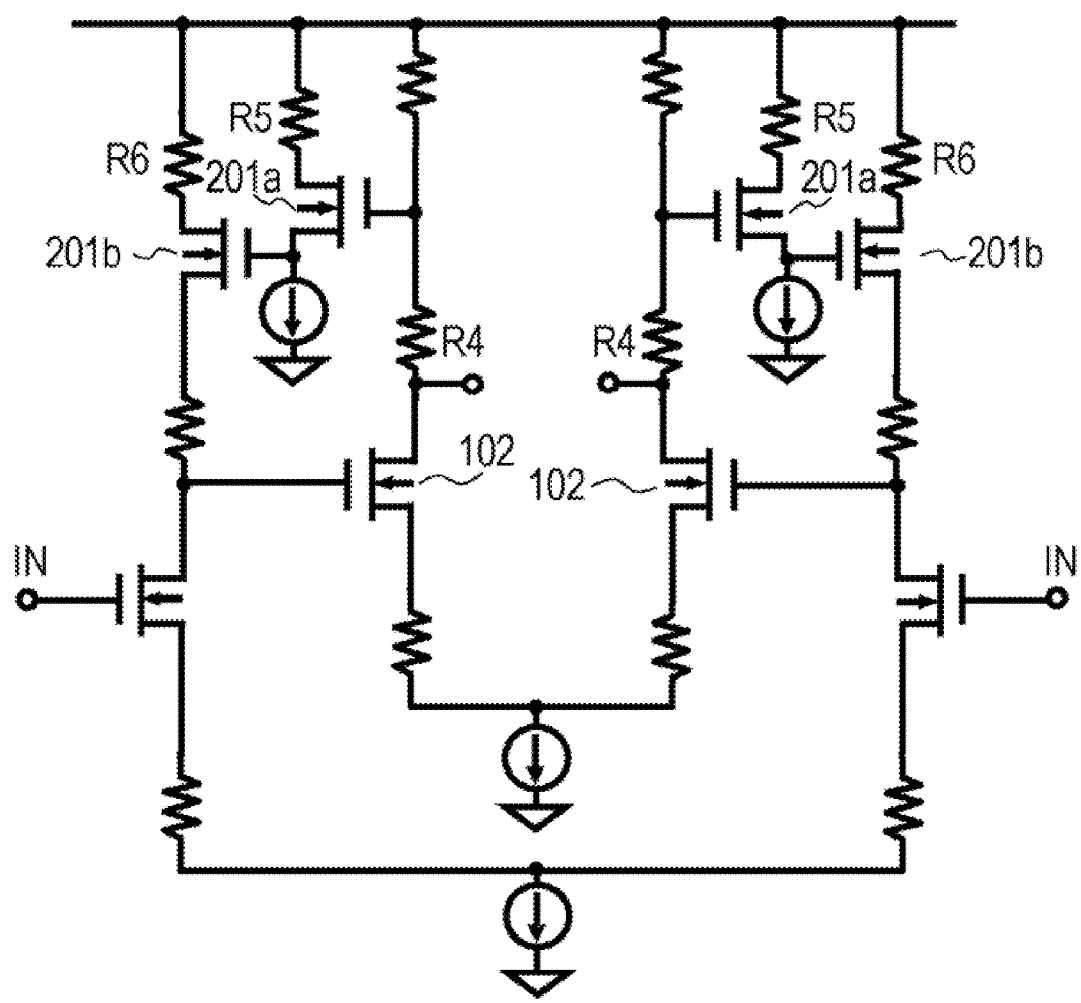
FIG. 13 illustrates a modification of the amplifier circuit (differential amplifier circuit) in the second embodiment.

FIGS. 11 to 13 illustrate modifications of the second embodiment (feedback differential amplifier circuit). In the respective figures, the elements of which reference numerals are omitted are the same as those in the second embodiment (FIGS. 5 and 6).

In the configuration illustrated in FIG. 11, resistors (source resistors) R4 connected to the drain terminals of the output-stage transistors 102 in the second embodiment (FIG. 5) are further provided. In the configuration illustrated in FIG. 12, the connection form of the constant current sources connected to the source terminals of the first feedback transistors 201a is modified. In the configuration illustrated in FIG. 13, resistors R5 and R6 connected to the drain terminals of the first feedback transistors 201a and the drain terminals of the second feedback transistors 201b are further provided to the configuration illustrated in FIG. 11. The respective elements further provided in FIGS. 11 to 13 may be appropriately adopted in combination.

Furthermore, a feedback amplifier circuit (feedback differential amplifier circuit) may be configured by combining the two-stage emitter-grounded amplifier circuit 10 (e.g., multistage amplifier unit) in the first embodiment and modifications of the first embodiment (FIGS. 2, 3, and 7 to 10) and the feedback circuit 200 (e.g., feedback unit) in the second embodiment and modifications of the second embodiment (FIGS. 5, 6, and 11 to 13) as desired. On the other hand, a feedback amplifier circuit (feedback differential amplifier circuit) may be configured by combining the feedback circuit 20 (e.g., feedback unit) in the first embodiment and modifications of the first embodiment and the two-stage source-grounded amplifier circuit 100 (e.g., multistage amplifier unit) in the second embodiment and modifications of the second embodiment.

In those various modifications, as in the first and second embodiments, a large-amplitude output may be realized while ensuring a broadband frequency characteristic.

As described above, in the amplifier circuits in the above-described embodiments, DC design and adjustment of the operating-point potential of output may be easily performed with a relatively simple configuration, and ensuring a broadband frequency characteristic and a large-amplitude output, which have conventionally been difficult, may be achieved. Accordingly, an amplifier circuit (driver circuit) favorable for a driver IC for an optical modulator used in a high-speed optical transmission system, particularly an optical modulator using an electro-optic effect (LN modulator or the like), may be realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An amplifier circuit comprising:
   a multistage amplifier unit including an input-stage transistor and an output-stage transistor and configured to amplify an input signal and to output an amplified signal; and
   a feedback unit including a first feedback transistor, a second feedback transistor, and a feedback resistor, and configured to feed back the amplified signal to an input of the output-stage transistor in the multistage amplifier unit via the first feedback transistor, the second feedback transistor, and the feedback resistor.

2. The amplifier circuit according to claim 1, wherein,
   the input-stage transistor and the output-stage transistor are emitter-grounded transistors amplifying a signal to a base terminal and outputting an amplified signal from a collector terminal, and
   a load resistor is connected to the collector terminal of the output-stage transistor.

3. The amplifier circuit according to claim 2, wherein a constant current source is connected to an emitter terminal of the input-stage transistor and the output-stage transistor.

4. The amplifier circuit according to claim 2, wherein, in the feedback unit,
the first feedback transistor is a collector-grounded transistor, the base terminal of the first feedback transistor being connected to an output terminal of the output-stage transistor;
the second feedback transistor is a collector-grounded transistor, the base terminal of the second feedback transistor being connected to an emitter terminal of the input-stage transistor; and
the feedback resistor is provided between a collector terminal of the second feedback transistor and an input terminal of the output-stage transistor.

5. The amplifier circuit according to claim 4, wherein a constant current source is connected to the emitter terminal of the first feedback transistor.

6. The amplifier circuit according to claim 1, wherein,
the input-stage transistor and the output-stage transistor are source-grounded transistors and are configured to amplify a signal input to a gate terminal and to output the signal from a drain terminal; and
a load resistor is connected to the drain terminal of the output-stage transistor.

7. The amplifier circuit according to claim 6, wherein a constant current source is connected to a source terminal of the input-stage and output-stage transistor.

8. The amplifier circuit according to claim 6, wherein,
the first feedback transistor is a drain-grounded transistor, and the gate terminal of the first feedback transistor is connected to an output terminal of the output-stage transistor;
the second feedback transistor is a second drain-grounded transistor, and the gate terminal of the second feedback transistor is connected to a source terminal of the first feedback transistor; and
the feedback resistor is provided between a drain terminal of the second feedback transistor and an input terminal of the output-stage transistor.

9. The amplifier circuit according to claim 8, wherein a constant current source is connected to the source terminal of the first feedback transistor.

* * * * *